(12) United States Patent
Pun et al.

(10) Patent No.: US 7,724,170 B2
(45) Date of Patent: May 25, 2010

(54) SENSOR INTERFACE DEVICES AND AMPLIFIERS

(75) Inventors: Kong Pang Pun, Hong Kong (CN); Chiu Sing Oliver Choy, Hong Kong (CN)

(73) Assignee: The Chinese University of Hong Kong, Hong Kong (CN)

( * ) Notice: Subject to any disclaimer, the term of this patent is extended or adjusted under 35 U.S.C. 154(b) by 7 days.

(21) Appl. No.: 12/169,520

(22) Filed: Jul. 8, 2008

(65) Prior Publication Data

US 2009/0140900 A1  Jun. 4, 2009

Related U.S. Application Data

(60) Provisional application No. 60/991,753, filed on Dec. 2, 2007.

(51) Int. Cl.
*H03M 3/00* (2006.01)
(52) U.S. Cl. .......................................... 341/143; 330/9
(58) Field of Classification Search ......... 341/143–165; 330/9
See application file for complete search history.

(56) References Cited

U.S. PATENT DOCUMENTS

| | | | |
|---|---|---|---|
| 6,262,626 B1 | 7/2001 | Bakker et al. | |
| 6,590,517 B1 * | 7/2003 | Swanson | 341/155 |
| 6,639,532 B1 * | 10/2003 | Liu et al. | 341/143 |
| 6,734,723 B2 * | 5/2004 | Huijsing et al. | 330/9 |
| 7,038,532 B1 * | 5/2006 | Bocko et al. | 330/9 |
| 7,233,198 B2 * | 6/2007 | Niederkorn | 330/9 |
| 7,391,351 B2 * | 6/2008 | Pertijs et al. | 341/143 |
| 7,545,302 B1 * | 6/2009 | Silva et al. | 341/143 |

OTHER PUBLICATIONS

Martin, K. et al., "A Differential Swtiched-Capacitor Amplifier," IEEE Journal of Solid-State Circuits 22(1):104-106, Feb. 1987.

\* cited by examiner

*Primary Examiner*—Lam T Mai
(74) *Attorney, Agent, or Firm*—Robert Iannucci; Seed IP Law Group PLLC

(57) ABSTRACT

Disclosed are a sensor interface device and an amplifier used in a sensor system. The sensor interface device in one implementation has a first chopper configured to shift input signals of the sensor system from a baseband frequency to a first frequency, an instrumentation amplifier configured to amplify the shifted signals, a bandpass Delta-Sigma modulator configured to digitize the amplified signals, and a second chopper configured to shift the digitized signals from the a first frequency back to the baseband frequency. The instrumentation amplifier removes the DC offset generated from the first chopper and therefore all sources of DC offset are eliminated in this interface device without bandwidth limitation.

13 Claims, 4 Drawing Sheets

SENSOR INTERFACE DEVICES AND AMPLIFIERS

CROSS-REFERENCES TO RELATED APPLICATIONS

This application claims the benefit of U.S. Provisional Patent Application Ser. No. 60/991,753, filed on Dec. 2, 2007, entitled "Amplifier and Analog-to-digital Converter Circuits Comprising Means for Reducing DC-offset and Flicker Noise", which is herein incorporated by reference in its entirety.

TECHNICAL FIELD OF THE INVENTION

This invention generally relates to a sensor interface device and an amplifier. In particular, the invention relates to a sensor interface device for reducing DC-offset and flicker noise.

BACKGROUND OF THE INVENTION

Sensor systems are widely used in the fields of industrial and medical electronics, wherein a sensor interface device is essential to establish a link between a sensor of a sensor system and the rest components of the same.

The sensor systems, to which the invention relates, have two common characteristics. Firstly, the output signal of a sensor in the sensor systems is a voltage quantity and has very small amplitude. For example, a bridge gauge sensor often generates a peak differential voltage in the order of a few tens mini-volt and the electroencephalogram signal has a magnitude less than 1 $\mu V$. Secondly, the output signal has a low bandwidth, or at most, a medium bandwidth. For example, a 10 Hz bandwidth is sufficient in strain gauge stress sensors. In bio-potential acquisitions, most input signals have a bandwidth less than 1 kHz.

Key requirements of these sensors are low DC-offset and low flicker noise because these errors are indistinguishable from the signals of interest. Over the years, various techniques have been developed in this regard, including auto-zero (also known as correlated double sampling, CDS) and chopper techniques.

The chopper technique is now widely used in various applications. In this technique, an input signal is firstly modulated to a higher frequency by chopping it at a high frequency so that a desired signal can be distinguished from the low frequency offset and flicker noise. Then, the modulated signal is amplified by an amplifier and the amplified signal is chopped again at the same chopping frequency. The desired signal is modulated back to a baseband, while the offset and the flicker noise are shifted to a high frequency and can be removed by lowpass filtering, which can be implemented by the amplifier itself.

A problem with the conventional chopper technique is that the choppers themselves generate offset errors that are indistinguishable from the desired signal. The chopper-induced errors are often proportional to the chopping frequency. However, the frequency range of the flicker noise posts a limit on lowering the chopper frequency.

An improved technique called nested chopper technique uses a pair of inner choppers operating at a high frequency to reduce the flicker noise, and a pair of outer choppers operating at a low frequency to suppress the DC-offset generated by the inner choppers. A drawback of the nested chopper technique is that, since the outer choppers operate at a very low frequency, the input signal bandwidth is limited.

SUMMARY OF THE INVENTION

Disclosed is a sensor interface device capable of reducing DC-offset and flicker noise without any limitation to an input bandwidth.

In one aspect, there is provided a sensor interface device used in a sensor system, comprising:
 a first chopper configured to shift analog input signals from a baseband frequency to a first frequency;
 an amplifier configured to amplify the shifted signals;
 a bandpass Delta-Sigma A/D converter configured to digitize the amplified signals; and
 a second chopper configured to shift the digitized signals from the first frequency back to the baseband frequency.

In another aspect, there is provided an amplifier comprising an input stage and an output stage, wherein the input stage comprises a first pair of capacitors, and the output stage comprises a second pair of capacitors, one of the first pair of capacitors being selectively coupled to one of second pair of capacitors by a second set of switches to determine a gain of the amplifier.

In summary, the sensor interface device take at least one of the following advantages over the prior art:
 The eliminations of the DC-offset and flicker noise for a sensor interface device by adding little overhead to the interface device; and
 the removal of the chopper-generated DC-offset without bandwidth limitation.

The detailed technology and preferred embodiments implemented for the subject invention are described in the following paragraphs accompanying the appended drawings for those skilled in this field to well appreciate the features of the claimed invention.

DETAILED DESCRIPTION OF THE INVENTION

The present invention will be described with reference to the accompanying drawings, but these drawings are presented only for the illustrative purpose and in no respect, are intended to limit the present invention anymore.

Figure 1:
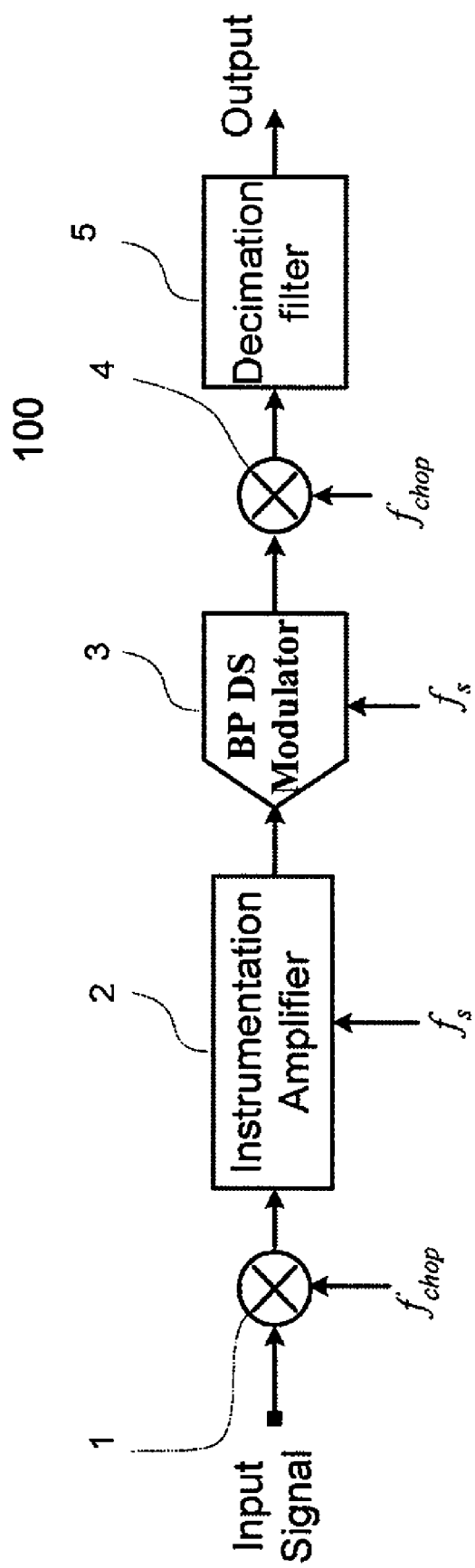
FIG. 1 illustrates a block diagram of a sensor interface device according to one embodiment of the invention.

FIG. 1 is a block diagram of a sensor interface device 100 according to one embodiment of the invention, comprising a first chopper 1, an instrumentation amplifier (IA) 2, a Bandpass (BP) Delta-Sigma A/D converter 3, a second chopper 4 and a decimation filter 5.

The sensor interface device accepts a voltage-mode input signal. Specifically, as showing in FIG. 1, the first chopper 1 which operates at a frequency denoted as $f_{chop}$ receives an input signal to shift the received signal from the baseband to $f_{chop}$. Herein, the first chopper 1 is an analog chopper and $f_{chop}$ must be greater than the corner frequency of the flicker noise in the system.

The IA 2 receives the output from the chopper 1 and amplifies the received signal. The gain of amplification of the IA 2 is set as required. The IA 2 is a sampled-date switched-capacitor circuit and operates at a sampling frequency denoted as $f_s$, which will be discussed by reference to FIG. 2 hereinafter.

The Delta-Sigma A/D converter 3 receives the amplified signal from the IA 2 and converts the analog signal to 1-bit digital signal. The Delta-Sigma A/D converter 3 is also a sampled-date switched-capacitor circuit and operates at a sampling frequency denoted as $f_s$ to digitize the amplified signal. Herein, the sampling frequency $f_s$ and the chopper frequency $f_{chop}$ must satisfy the following relationship: $f_s = n \times f_{chop}$, where n is an integer greater than two.

To accommodate the amplified input signal, the Delta-Sigma A/D converter 3 must have a signal band centered at $f_{chop}$. The Delta-Sigma A/D converter 3 can be a real bandpass Delta-Sigma modulator (DSM) or a complex bandpass Delta-Sigma modulator that suppresses quantization noise only at positive or negative frequency.

The 1-bit digital output of the Delta-Sigma A/D converter 3 is fed to the second chopper 4. The chopper 4 may be a digital mixer. It multiplies the digital output of the Delta-Sigma A/D converter 3 by a digital sinusoidal wave with the frequency $f_{chop}$. In the case that $f_s = 4 f_{chop}$, the chopper 4 multiplies the 1-bit digital signal with a simple digital pattern of +1, 0, −1, 0, .... The chopper 4 shifts the signal from $f_{chop}$ back to the baseband. Unlike the conventional chopper techniques, the chopper 4 is not placed immediately after the instrumentation amplifier 2, but after the Delta-Sigma A/D converter 3. The chopper 4 introduces no error because it is in the digital domain.

Due to the chopper 4 being placed in the digital domain, not only the DC-offset introduced by the IA 2 is removed, but also the DC-offsets introduced by the Delta-Sigma A/D converter 3 and any other analog circuits in the signal processing chain (if exists) are removed. In principle, the source of DC-offset is the chopper 1 itself. This error increases with the $f_{chop}$. Therefore, it is necessary to have a very low $f_{chop}$ to achieve a low residual DC-offset, as disclosed in U.S. Pat. No. 6,262,626 B1, issued to A. Bakker, et al. and titled with "Circuit comprising means for reducing the DC-offset and the noise produced by an amplifier", which is incorporated herein by reference in its entirety.

The decimation filter 5 is a conventional decimation filter consisting of a digital lowpass filter and a down-sampler. It removes the high frequency noises in the chopped signal from chopper 4, which include quantization noise, and DC and flicker noise that have been shifted to $f_{chop}$. The lowpass filtered signal is then down-sampled to the Nyquist rate of the desired signal, which in turn is outputted.

Figure 2:
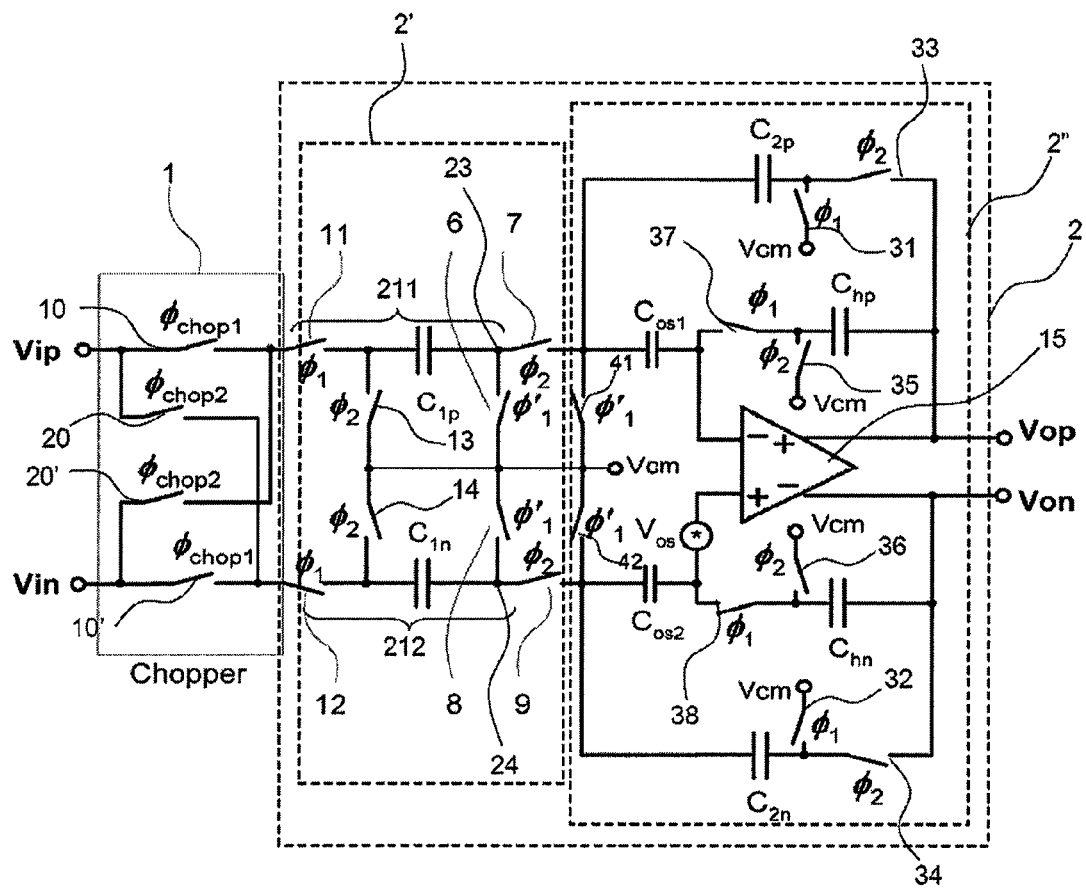
FIG. 2 illustrates the chopper and the instrumentation amplifier applied in FIG. 1.
Figure 3:
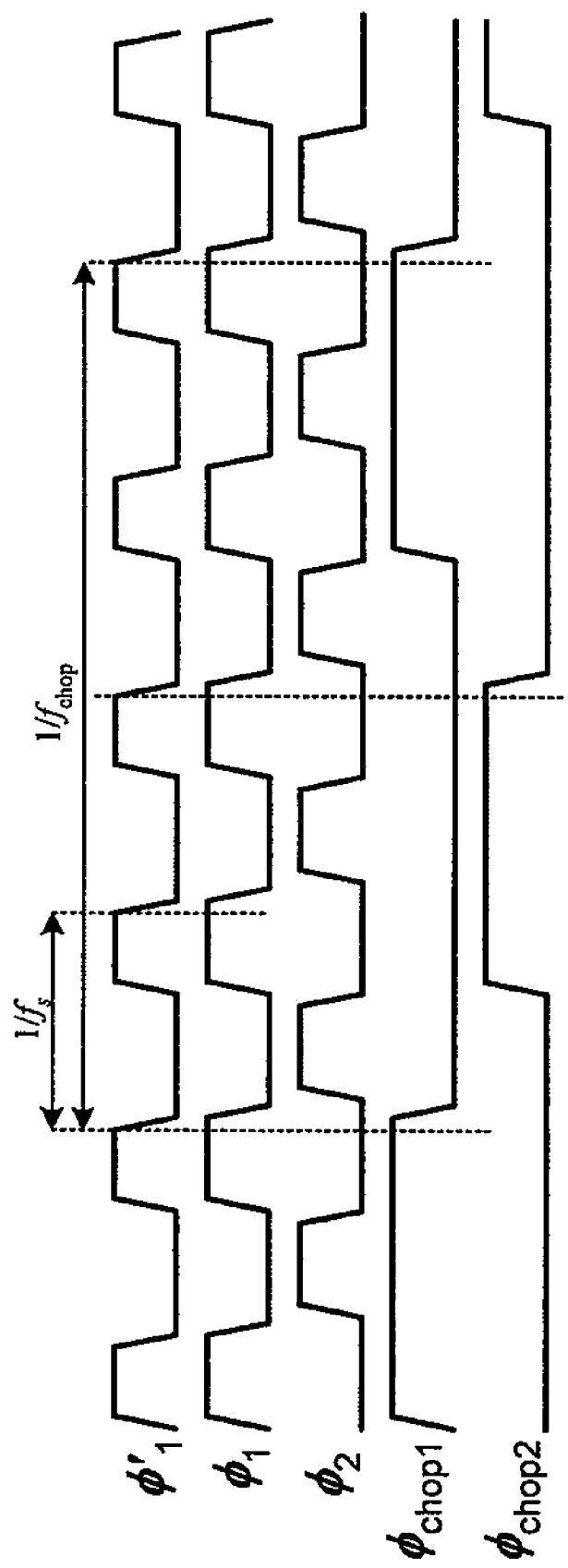
FIG. 3 illustrates clock waveforms of the chopper and the instrumentation amplifier of FIG. 2.

FIG. 2 illustrates the structure of the chopper 1 and the instrumentation amplifier 2 of FIG. 1 according to the invention. FIG. 3 illustrates clock waveforms of signals output from the chopper and the instrumentation amplifier.

As shown in FIG. 2, the first chopper 1 comprises two pairs of switches 10, 10' and 20, 20' controlled by phases $\phi_{chop1}$ and $\phi_{chop2}$, respectively, and receives a pair of differential inputs Vip and Vin. During $\phi_{chop1}$ (that is, the switches 10 and 10' are on), the inputs Vip and Vin are fed directly to the IA 2. During $\phi_{chop2}$ (that is, the switches 20 and 20' are on), the inputs Vip and Vin are reverted and then fed to the IA 2.

The IA 2 is a switched-capacitor instrumentation amplifier as disclosed by K. Martin, L. Ozcolak, Y. S. Lee and G. C. Temes, "A differential switched-capacitor amplifier", IEEE J. Solid-State Circuits, vol. 22, no. 2, pp. 104-106, February 1987, which is incorporated herein by reference in its entirety.

In particular, the IA 2 comprises an input stage 2' and an output stage 2". The input stage 2' comprises a first branch 211 and a second branch 212, both of which are coupled to the chopper 1 in parallel and used for receiving the outputs of the chopper 1, respectively. The first branch 211 includes a capacitor $C_{1p}$ and the second branch 212 includes a capacitor $C_{1n}$. The capacitor $C_{1p}$ and the capacitor $C_{1n}$ are coupled to the chopper 1 via a first set of switches, and are coupled to the output stage 2" via a second set of switches, respectively.

The first set of switches includes a pair of switches 11 and 12 controlled by $\phi_1$ and a pair of switches 13 and 14 controlled by $\phi_2$. The switches 11 and 12 are located in the first branch 211 and the second branch 212, respectively. As shown in FIG. 2, the switches 13 and 14 are connected to a common-mode DC voltage, $V_{cm}$, and are cascaded between the first and the second branches 211 and 212.

The second set of switches includes a pair of switches 7 and 9 controlled by $\phi_2$ and a pair of switches 6 and 8 controlled by $\phi_1'$. The switches 7 and 9 are located in the first branch 211 and the second branch 212, respectively, and are coupled to the capacitors $C_{1p}$ and $C_{1n}$ via a first connection note 23 and a second connection note 24, respectively. The switches 6 and 8 are connected to a common-mode DC voltage, $V_{cm}$, and are cascaded between the first connection note 23 and the second connection note 24, as shown in FIG. 2.

The output stage 2" includes an amplifying unit 15 with two inputs (i.e., input "−" and input "+") and two outputs (i.e., $V_{op}$ and $V_{on}$). The two inputs are coupled to the first and the second branches of the input stage 2' via a capacitor $C_{os1}$ and a capacitor $C_{os2}$, respectively. Between the input "−" and the output $V_{op}$, there is provided with a capacitor $C_{hp}$ such that the capacitor $C_{hp}$ is connected with the amplifying unit 15 in parallel. Similarly, between the input "+" and the output $V_{op}$, there is provided with a capacitor $C_{hn}$ such that the capacitor $C_{hn}$ is connected with the amplifying unit 15 in parallel.

In addition, the output stage 2" also includes a pair of capacitors comprising a capacitor $C_{2p}$ and a capacitor $C_{2n}$, which are connected across a branch consisting of the capacitor $C_{os1}$ and the unit 15, and a branch consisting of the capacitor $C_{os2}$ and the amplifier unit 15, respectively, as show in FIG. 2.

The source of DC-offset by the chopper 1 is the charge injection of the switches 10, 10', 20, 20', 11 and 12 at the moments when they open. FIG. 3 shows the clock waveforms for a specific case that $f_s = 4 f_{chop}$ (note that in general $f_s = n \times f_{chop}$, where n is an integer greater than two). As shown in FIG. 3, the falling edges of $\phi'_1$ occur slightly earlier than the corresponding falling edges of $\phi_1$, $\phi_{chop1}$ and $\phi_{chop2}$. Switches 6 and 8 open slightly earlier than switches 11 and 12 and the switches 10, 10', 20 and 20'. With the presence of switches 6, 7, 8, and 9, the right terminals of the input sampling capacitors $C_{1p}$ and $C_{1n}$ are open-circuited at the moment when the chopper switches 10, 10', 20 and 20' and the switches 11 and 12 open. Therefore, no charges injection from the chopper switches 10, 10', 20 and 20' to the sampling capacitors $C_{os1}$ and $C_{os2}$ occurs. Hence the DC-offset generated by the chopper 1 can be completely removed. Furthermore, the performance of the DC-offset cancellation is independent of the chopper frequency $f_{chop}$. It should be noticed that without switches 6, 7, 8, and 9, the capacitors $C_{1p}$ and $C_{1n}$ would not have their right terminal open-circuited at the moment when the switches 10, 10', 20 and 20' open, and the DC-offset generated by the chopper 1 would exit in the circuit.

Referring to FIG. 2 again, when $\phi_1$ and $\phi'_1$ are high, switches 37, 38, 31, 32, 41 and 42 in stage 2" close. Capacitors $C_{2p}$ and $C_{2n}$ are discharged. Capacitors $C_{os1}$ and $C_{os2}$ sample the offset at the input of the amplifying unit 15. When $\phi_2$ is high, and switches 33, 34, 35 and 36 close. The signal charges from stage 2' inject to capacitors $C_{2p}$ and $C_{2n}$ through switches 7 and 8 and the input voltage signal gets amplified at the output of the amplifying unit 15, with a gain of $C_{1p}/C_{2p}$ (or equivalently $C_{1n}/C_{2n}$). Capacitors $C_{hp}$ and $C_{hn}$ store the outputs in this clock phase and keep the outputs at these values in the next clock phase to reduce the finite bandwidth effect of the amplifying unit 15.

The gain of the IA 2 is determined by the capacitance ratio $C_{1p}/C_{2p}$ (or equivalently $C_{1n}/C_{2n}$). The capacitors $C_{os1}$ and $C_{os2}$ are used to perform correlated double sampling to compensate the finite op-amp gain effect of the unit 15, as well as to suppress the low frequency noises. In particular, the error introduced by the finite op-amp gain effect and other low frequency noise (including the DC-offset which is represented by the voltage source Vos in FIG. 2) are sampled and stored in the capacitors $C_{os1}$ and $C_{os2}$ during φ1. In the charge transfer phase φ₂, the error is subtracted at the left terminals of $C_{os1}$ and $C_{os2}$ where good virtual grounds are maintained so that complete charge transfer from stage 2' to stage 2" occurs.

Note that the sensor interface device 100 of FIG. 1 can also use other instrumentation amplifier 2 which does not use the correlated double sampling technique, given that the chopper frequency is higher than the corner frequency of the flicker noise. However, the correlated double sampling technique must be used in the sensor interface device 200 of FIG. 4 where the chopper frequency is lower that the corner frequency of the flicker noise, which will be discussed latter by reference to FIG. 4.

Figure 4:
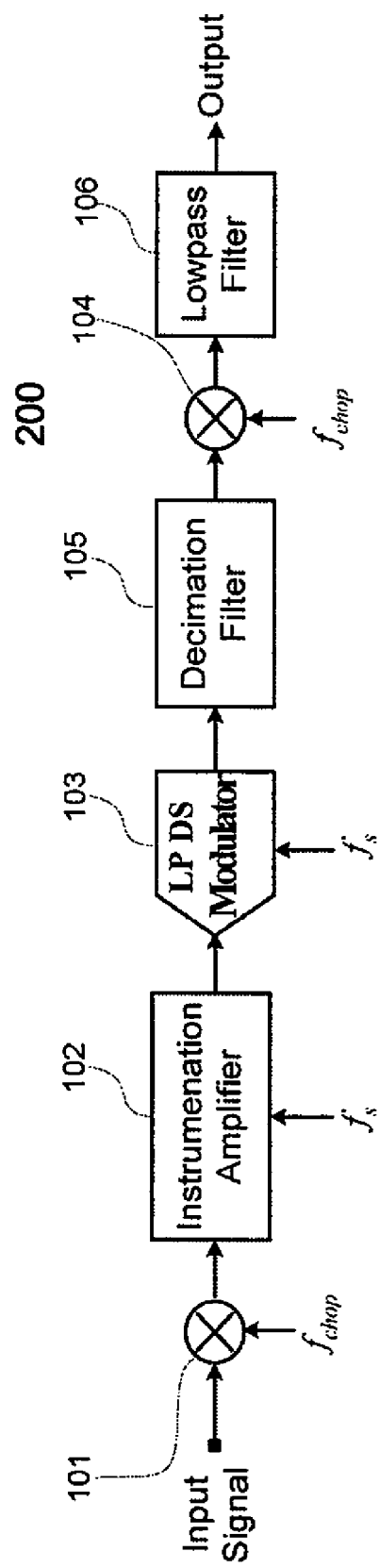
FIG. 4 illustrates a block diagram of a sensor interface device according to another embodiment of the invention.

FIG. 4 illustrates a block diagram of a sensor interface device 200 according to another embodiment of the invention, comprising a first chopper 101, an instrumentation amplifier 102, a lowpass (LP) Delta-Sigma A/D converter 103, a second chopper 104, a decimation filter 105 and a low-pass filter 106. In this embodiment, components 101, 102, 104 and 105 of sensor interface device 200 in FIG. 4 are the same as those counterparts 1, 2 and 4 of the sensor interface device 100 of FIG. 1, respectively, and the detailed description thereof are omitted. The differences between the sensor interface device 200 and the sensor interface device 100 are that:

the second chopper 104 is connected between the decimation filter 105 and the low-pass filter 106, which will be discussed below;

the A/D converter 103 is a low-pass Delta-Sigma modulator instead of a band-pass one;

the chopper frequency is very low; and a low-pass filter 106 is incorporated, which will be discussed below.

Note that the relationship $f_s = n \times f_{chop}$, where n is an integer greater than two, must still be satisfied in the sensor interface device 200. The sensor interface device 200 is intended for applications where the bandwidth of input signals is very low. The DC-offset generated by the chopper 101 is removed by the special circuit of the instrumentation amplifier 102. The DC-offset from the instrumentation amplifier 102 and the A/D converter 103 are shifted to $f_s$ by the chopper 104 and can later be filtered out by lowpass filter 106. The flicker noise, however, cannot be removed by the chopper 101 because the chopper frequency is lower than the corner frequency of the flicker noise. The flicker noise is removed by the correlated double sampling technique adopted in the instrumentation amplifier 102, which uses the circuit of FIG. 2.

According to the invention, the A/D converter 103 of the sensor interface device 200 needs to accommodate a desired signal modulated at $f_{chop}$. Assume the input signal has a bandwidth of 10 Hz, $f_{chop}$ is set as 20 Hz. The A/D converter 103 must have a pass-band covering the frequency range from 10 Hz to 30 Hz to cover the 10 Hz wide signal band around $f_s$, instead of from DC to 10 Hz. To have a simple design, a low-pass modulator 106 having a passband from DC to 40 Hz is provided. This extra bandwidth requirement is considered minor for a low speed Delta-Sigma modulator. After digitization and decimation, the resulted signal, which is centered around 20 Hz and has a sampling rate of 40 Hz, is modulated by the chopper 104 operating at 20 Hz and shifted back to DC. The DC-offset of the sensor interface device 200 has been shifted to 20 Hz and can be removed by the low-pass filter 106, which may be an infinite impulse response (IIR) or infinite impulse response (FIR) low pass filter having a cut-off frequency of 10 Hz and a sampling frequency of 40 Hz.

While the components 1, 2, 3, 4 and 5 of FIG. 1 as well the components 101, 102, 103, 104, 105 and 106 of FIG. 4 are described as separate elements, respectively, the invention is not limited thereto. It should be understood that those components may be implemented as lesser or more components as required.

Though embodiments and implementations of the invention have been shown and described, it should be understood that various other changes in form and details may be made therein without departing from the spirit of the invention.

The invention claimed is:

1. A sensor interface device, comprising:
   a first chopper configured to shift analog input signals from a baseband frequency to a first frequency;
   an amplifier configured to amplify the shifted signals;
   a bandpass Delta-Sigma A/D converter configured to digitize the amplified signals; and
   a second chopper configured to shift the digitized signals from the first frequency back to the baseband frequency.

2. The sensor interface device of claim 1, wherein the A/D converter is one selected from the group consisting of a real bandpass Delta-Sigma modulator and a complex bandpass Delta-Sigma modulator.

3. The sensor interface device of claim 2, further comprising:
   a decimation filter configured to remove high frequency noises from the shifted signals received from the second chopper.

4. The sensor interface device of claim 1, wherein the A/D converter is a low-pass Delta-Sigma Modulator.

5. The sensor interface device of claim 4, further comprising:
   a decimation filter configured to filter out high frequency noises from the digitized signals received from the A/D converter,
   wherein, the second chopper shifts the filtered signals from the first frequency back to the baseband frequency.

6. The sensor interface device of claim 1, wherein the amplifier and the A/D converter operate at a second frequency, and wherein the second frequency=n×the first frequency, where n is an integer greater than two.

7. The sensor interface device of claim 1, wherein the second chopper multiplies the modulated signal by a digital wave with the first frequency to shift the digitized signals from the first frequency back to the baseband frequency.

8. The sensor interface device of claim 7, further comprising:
   a lowpass filter configured to remove a DC-offset noise of the amplifier and the bandpass Delta-Sigma A/D converter from the digitized signals shifted by the second chopper.

9. The sensor interface device of claim 1, wherein the amplifier comprises an input stage and an output stage, and
   wherein the input stage comprises a first pair of capacitors, and the output stage comprises a second pair of capacitors, one of the first pair of capacitors being selectively coupled to one of second pair of capacitors by a set of switches to determine a gain of the amplifier.

10. The sensor interface device of claim 9, wherein the first chopper comprises a plurality of switches, and wherein the set of switches are controlled to make the first pair of capacitors open-circuited so that no charge injection from the input stage to the output stage occurs at moments when the switches in the first chopper are open.

11. The sensor interface device of claim 10, wherein the set of switches comprise a first switch coupled to a first capacitor of the first pair of capacitors via a first connection node, a second switch coupled to a second capacitor of the first pair of capacitors via a second connection node, and a third switch and a fourth switch cascaded between the first connection node and the second connection node.

12. The sensor interface device of claim 11, wherein the output stage comprises an amplifying unit having first and second inputs and two outputs, the first input being coupled to the first switch via a third capacitor, the second input being coupled to second switch via a fourth capacitor.

13. The sensor interface device of claim 12, wherein the output stage further comprises a fifth capacitor and a sixth capacitor being connected between one of the inputs and a corresponding one of the two outputs, respectively.

* * * * *